(12) United States Patent
Hu et al.

(10) Patent No.: US 8,987,083 B1
(45) Date of Patent: Mar. 24, 2015

(54) UNIFORM GATE HEIGHT FOR SEMICONDUCTOR STRUCTURE WITH N AND P TYPE FINS

(71) Applicant: GLOBALFOUNDRIES Inc., Grand Cayman (KY)

(72) Inventors: Zhenyu Hu, Clifton Park, NY (US); Zhao Lun, Ballston Lake, NY (US); Xing Zhang, Ballston Lake, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/202,985

(22) Filed: Mar. 10, 2014

(51) Int. Cl.
*H01L 21/8238* (2006.01)
*H01L 27/108* (2006.01)
*H01L 29/76* (2006.01)
*H01L 29/66* (2006.01)
*H01L 29/78* (2006.01)
*H01L 21/308* (2006.01)
*H01L 29/06* (2006.01)

(52) U.S. Cl.
CPC .......... *H01L 29/6681* (2013.01); *H01L 29/785* (2013.01); *H01L 21/308* (2013.01); *H01L 29/0657* (2013.01)
USPC ............ 438/212; 438/268; 257/302; 257/350

(58) Field of Classification Search
CPC ................... H01L 29/66545; H01L 29/66795; H01L 29/7834
USPC ................. 438/156, 157, 212, 222, 268, 269; 257/302, 328, 350
See application file for complete search history.

(56) References Cited

U.S. PATENT DOCUMENTS

2014/0203370 A1\* 7/2014 Maeda et al. ................. 257/365

\* cited by examiner

*Primary Examiner* — Hsien Ming Lee
(74) *Attorney, Agent, or Firm* — Wayne F. Reinke, Esq.; Heslin Rothenberg Farley & Mesiti P.C.

(57) ABSTRACT

In a non-planar based semiconductor process where the structure includes both N and P type raised structures (e.g., fins), and where a different type of epitaxy is to be grown on each of the N and P type raised structures, prior to the growing, a lithographic blocking material over one of the N and P type raised structure portions is selectively etched to expose and planarize a gate cap. After the first type of epitaxy is grown, the process is repeated for the other of the N and P type epitaxy.

10 Claims, 4 Drawing Sheets

UNIFORM GATE HEIGHT FOR SEMICONDUCTOR STRUCTURE WITH N AND P TYPE FINS

BACKGROUND OF THE INVENTION

1. Technical Field

The present invention generally relates to fabrication of non-planar semiconductor structures. More particularly, the present invention relates to preventing non-uniform gate height over N and P type raised structures on the substrate, by selective etching of a lithographic blocking material to expose a gate cap and planarizing the gate cap prior to growing epitaxy on the N type raised structures and P type raised structures.

2. Background Information

In a conventional fin-based semiconductor process with both N and P type fins, when growing epitaxy on top of the fins (one kind for N type fins, and a different kind for P type fins), the protective materials used during lithography for both types of fins overlap in a small area above the gate, resulting in a non-uniform gate height over the different epitaxies.

Therefore, a need exists for a way to prevent the non-uniform gate height during the use of lithography.

SUMMARY OF THE INVENTION

The shortcomings of the prior art are overcome and additional advantages are provided through the provision, in one aspect, of a method of preventing non-uniform gate height over N and P type raised structures. The method includes providing a non-planar semiconductor structure, the structure including a semiconductor substrate, at least one first raised semiconductor structure of N or P type coupled to the substrate, at least one second raised semiconductor structure of opposite N or P type coupled to the substrate, and at least one dummy gate structure situated over and encompassing a portion of the at least one first and the at least one second raised structures, the dummy gate structure including a conformal layer of a dummy gate material and a gate cap layer over the dummy gate material. The method further includes masking one of the at least one first and the at least one second raised structure and a portion of the dummy gate structure thereover with a layer of lithographic blocking material, selectively etching the layer of lithographic blocking material to expose the gate cap layer of the masked one of the at least one first and the at least one second raised structure, and planarizing all of a top surface of the gate cap layer.

In accordance with another aspect, a non-planar semiconductor structure is provided. The structure includes a semiconductor substrate, at least one first raised semiconductor structure of N or P type coupled to the substrate, at least one second raised semiconductor structure of the other of N or P type coupled to the substrate, and at least one dummy gate structure situated over and encompassing a portion of the at least one first and the at least one second raised semiconductor structures, the dummy gate structure including a conformal layer of a dummy gate material and a gate cap layer over the dummy gate material. The structure further includes a layer of lithographic blocking material over a portion of the dummy gate structure above one of the at least one first raised semiconductor structure and the at least one second raised semiconductor structure, a top surface of the gate cap layer being planarized below a top surface of the layer of lithographic blocking material.

These, and other objects, features and advantages of this invention will become apparent from the following detailed description of the various aspects of the invention taken in conjunction with the accompanying drawings.

DETAILED DESCRIPTION OF THE INVENTION

Figure 1:
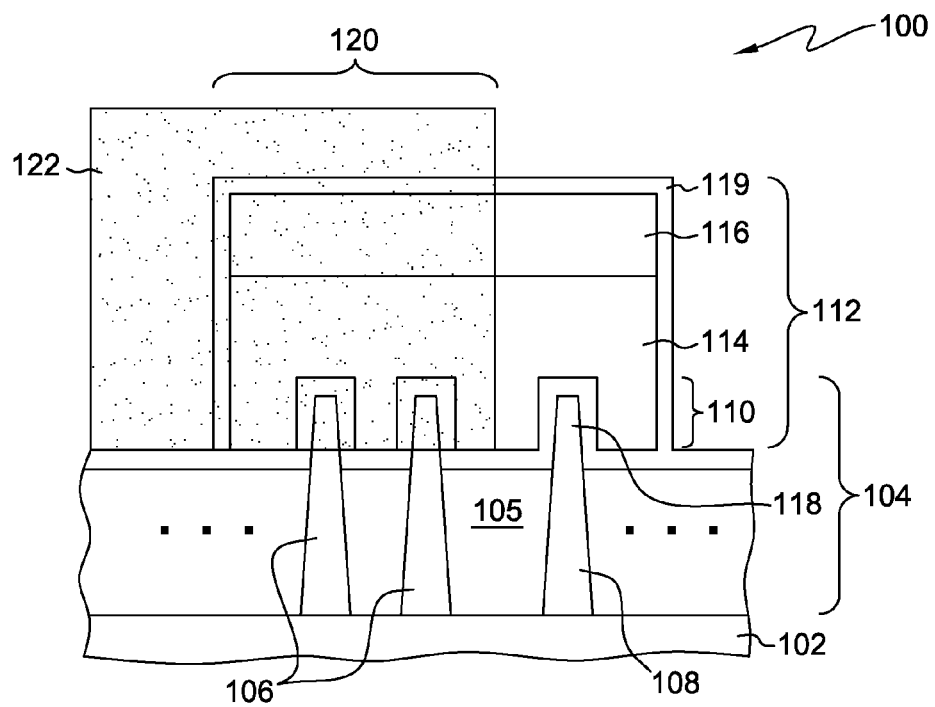
FIG. 1 depicts a cross-sectional plan view of a non-planar semiconductor structure having both N and P type raised semiconductor structures, a dummy gate structure and a lithographic blocking material over the N type raised structures.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Reference is made below to the drawings, which are not drawn to scale for ease of understanding, wherein the same reference numbers are used throughout different figures to designate the same or similar components.

FIG. 1 depicts a cross-sectional plan view of a semiconductor structure 100, including a substrate 102 and raised semiconductor structures 104 (e.g., fins) with respect to the substrate. Between the bodies of the raised structures is one or more dielectric materials 105. In one example, a shallow trench isolation process is used to deposit the dielectric material(s). The raised structures include both N type 106 and P type 108. Above and encompassing a portion 110 of the raised structures is a gate structure 112, in this example, the gate structure including a layer 114 of a dummy gate material (e.g., polysilicon) and a gate cap layer 116 of a protective material (e.g., a nitride, for example, silicon nitride (SiN)). Conformally covering a neck portion (e.g., neck portion 118) of the raised structures, as well as the gate structure and dielectric material(s) 105, is a relatively thin (e.g., about 5 nm to about 10 nm) conformal layer 119 of a protective material, e.g., a nitride. Covering the N type portion 120 of the structure 100 is a layer 122 of a lithographic blocking material, for example, an organic planarizing layer (OPL). As one skilled in the art will know, OPL is highly selective to ashing (a dry etch), which uses a strongly oxidizing ambient, e.g., oxygen plasma ashing.

Figure 2:
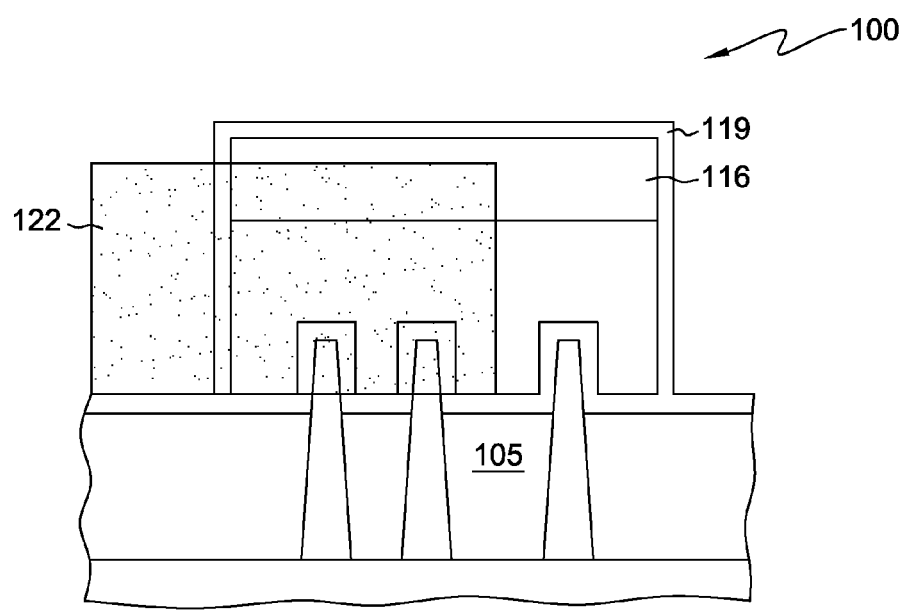
FIG. 2 depicts the semiconductor structure of FIG. 1 after selective etching of the lithographic blocking material to expose the gate cap of the dummy gate structure.

FIG. 2 is a cross-sectional plan view of the structure 100 of FIG. 1 after the layer of lithographic blocking material 122 has been etched to expose the gate cap 116. The etch used is preferably selective to the lithographic blocking material, in order to avoid etching the gate cap. Also preferably, the etch used for the lithographic blocking material will also remove the thin, conformal layer of protective material 119 above the gate cap, as well as about the P type raised structure neck(s) 118 and above the dielectric(s) 105. In one example, where the lithographic blocking material is OPL, ashing may be used for the etch, e.g., oxygen plasma ashing.

Figure 3:
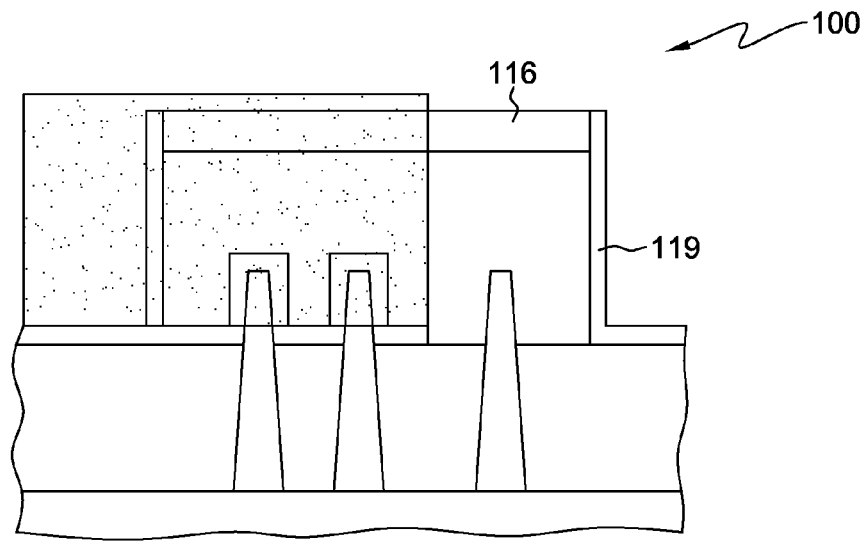
FIG. 3 depicts the semiconductor structure of FIG. 2 after planarizing the gate cap.

With the gate cap exposed, it can be planarized across both N and P type sections, as shown in FIG. 3. In one example, where the gate cap is silicon nitride (SiN), the planarization can be accomplished by, for example, using a dry etch process. With the neck(s) of the P type raised structures exposed, epitaxy 124 (see FIG. 4) can be grown thereon after recessing the neck(s).

Figure 4:
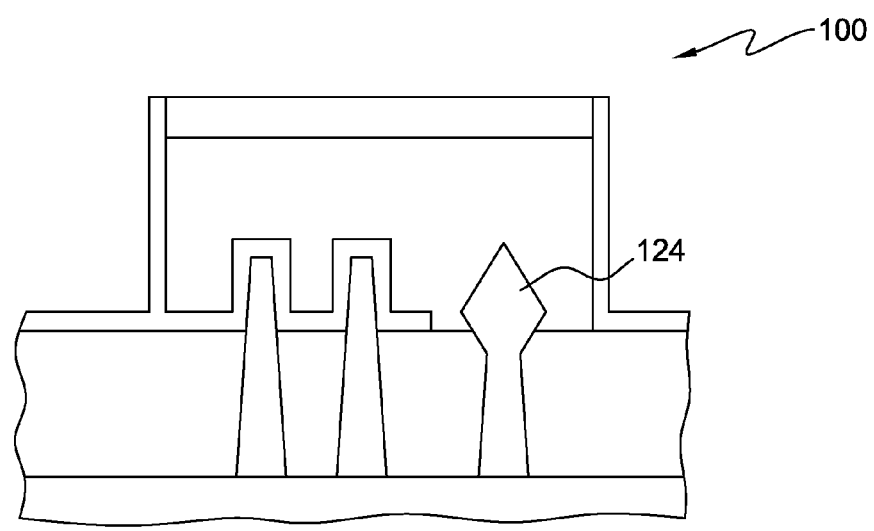
FIG. 4 depicts the semiconductor structure of FIG. 3 after removing the lithographic blocking material and growing epitaxy on the P type raised structures.

In one example, as shown in FIG. 4, epitaxial silicon germanium (SiGe) is grown on the P type raised structures. As one skilled in the art will know, SiGe naturally grows into an elongated diamond shape. After removing the lithographic blocking material, a similar process may then be performed for the N type raised structures. In one example, where the lithographic blocking material is OPL, it can be removed by, for example, oxygen or Diazene ($N_2H_2$) ashing.

Figure 5:
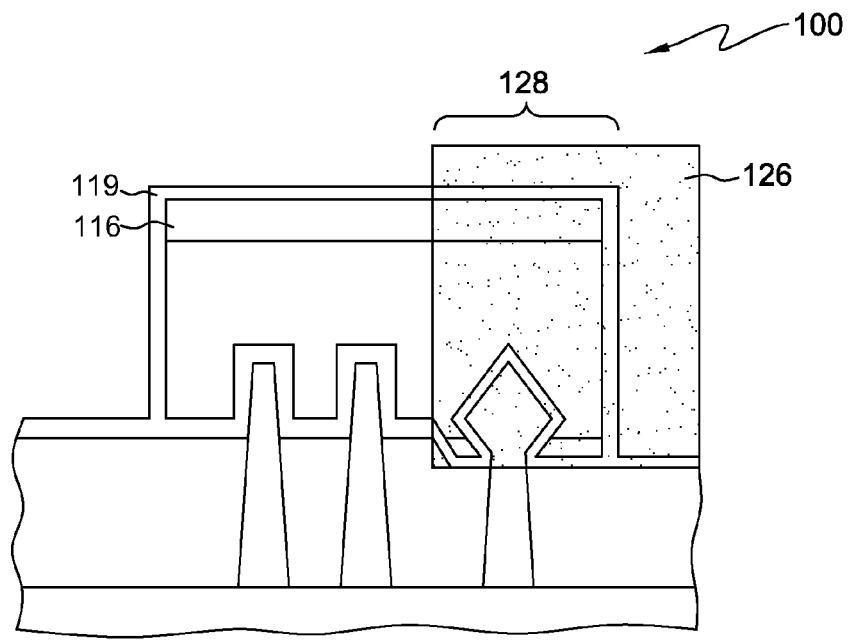
FIG. 5 depicts the semiconductor structure of FIG. 4 after adding a layer of lithographic blocking material over the P type portion of the semiconductor structure.
Figure 6:
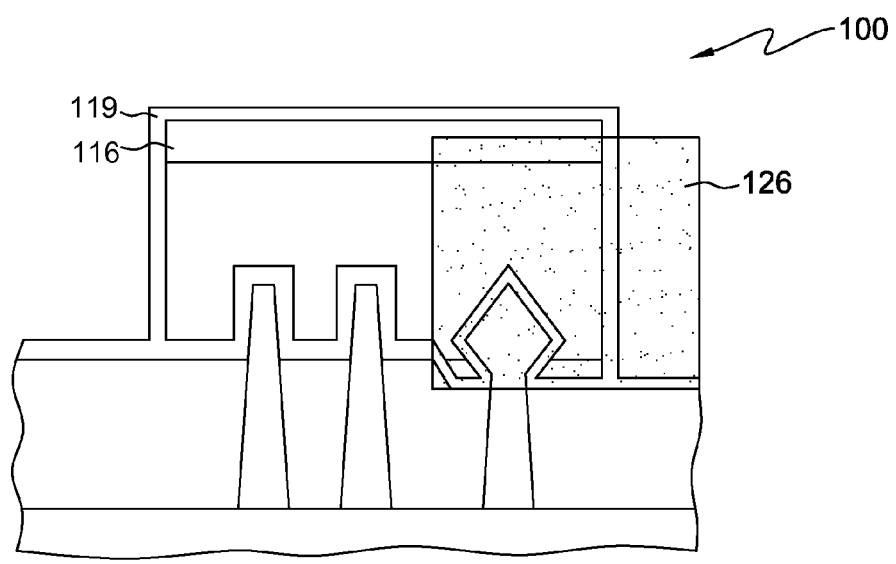
FIG. 6 depicts the semiconductor structure of FIG. 5 after selectively etching the lithographic blocking material to expose the gate cap.

As shown in FIG. 5, the thin, conformal layer of protective material 119 is restored above the gate cap and now covers the epitaxy atop the P type raised structures. A layer of lithographic blocking material 126 (e.g., OPL) now covers the P type portion 128 of structure 100. In one example, the layer of lithographic blocking material is deposited using a commercially available lithographic track tool. Similar to the process for the N type section, the layer of lithographic blocking material 126 is etched, as shown in FIG. 6, to expose the gate cap 116. As noted above, the etch used is preferably selective to the lithographic blocking material, to avoid etching the gate cap. For example, where the gate cap is SiN, a dry etch may be used.

Figure 7:
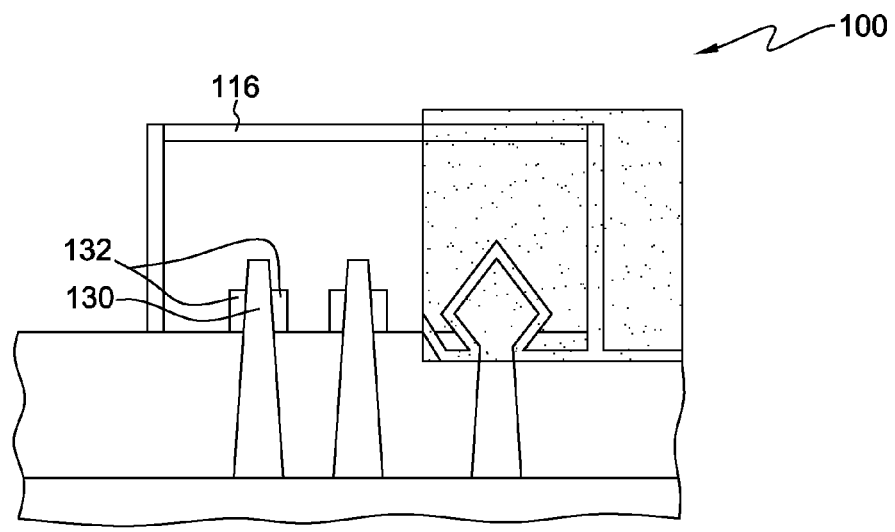
FIG. 7 depicts the semiconductor structure of FIG. 6 after planarizing the gate cap and protecting the necks of the N type raised structures.
Figure 8:
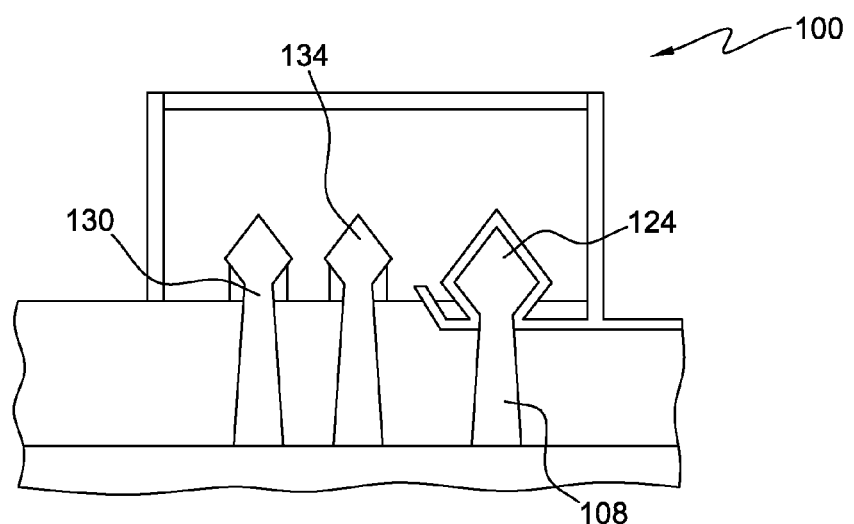
FIG. 8 depicts the semiconductor structure of FIG. 7 after removal of the lithographic blocking material and growing epitaxy on the N type raised structures above the protected necks.

After the gate cap 116 has been exposed, it can be planarized, as shown in FIG. 7. As with the N type section, the gate cap etch also preferably removes the thin, conformal layer of protective material 119 above the gate cap (see FIG. 6) and the N type raised structures, except for the neck area thereof (e.g., neck 130). A layer 132 of the protective material remains around the N type necks. The epitaxial material used for the N and P type raised structures is different, and different epitaxial materials grow at different rates. In the present example, the N type epitaxy may include, for example, silicon phosphorus (SiP), which grows more slowly than, for example, silicon germanium used for the P type raised structures. In general, the goal is to have the N and P type epitaxy end at about the same height. Thus, as shown in FIG. 8, slower growing epitaxy 134 together with a longer raised structure neck 130 on the N type raised structures 106 will be at a similar height as relatively faster growing epitaxy 124 and a shorter neck or none on the P type raised structures 108.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:
1. A method, comprising:
    providing a non-planar semiconductor structure, the structure comprising: a semiconductor substrate; at least one first raised semiconductor structure of N or P type coupled to the substrate; at least one second raised semiconductor structure of opposite N or P type coupled to the substrate; and at least one dummy gate structure situated over and encompassing a portion of the at least one first and the at least one second raised structures, the dummy gate structure comprising a conformal layer of a dummy gate material and a gate cap layer over the dummy gate material;

masking one of the at least one first and the at least one second raised structure and a portion of the dummy gate structure thereover with a layer of lithographic blocking material;

selectively etching the layer of lithographic blocking material to expose the gate cap layer of the masked one of the at least one first and the at least one second raised structure; and planarizing all of a top surface of the gate cap layer.

2. The method of claim 1, further comprising growing epitaxy on a top surface of the one of the at least one first and the at least one second raised structure after the planarizing.

3. The method of claim 2, further comprising, after growing the epitaxy:

removing the lithographic blocking material; and repeating the masking, selectively etching, planarizing, growing epitaxy and removing for the other of the at least one first and the at least one second raised structure.

4. The method of claim 3, wherein the semiconductor substrate comprises a bulk semiconductor substrate, wherein the at least one first raised semiconductor structure comprises a plurality of first raised semiconductor structures of the N or P type coupled to the bulk semiconductor substrate, wherein the at least one second raised semiconductor structure comprises a plurality of second raised semiconductor structures of the opposite N or P type, wherein the masking comprises masking one of the plurality of first raised semiconductor structures and the plurality of second raised semiconductor structures with the layer of lithographic blocking material, wherein growing epitaxy comprises growing epitaxy on the top surface of the one of the plurality of first raised structures and the plurality of second raised structures, and wherein the repeating comprises repeating the masking, selective etching, planarizing, growing epitaxy and removing for the other of the plurality of first raised structures and the plurality of second raised structures.

5. The method of claim 2, wherein for the at least one raised semiconductor structure of P type, growing the epitaxy comprises growing epitaxial silicon germanium.

6. The method of claim 2, wherein for the at least one raised semiconductor structure of N type, growing the epitaxy comprises growing epitaxial silicon phosphorus.

7. The method of claim 2, further comprising, for the at least one raised semiconductor structure of N type, protecting a neck thereof prior to growing the epitaxy.

8. A non-planar semiconductor structure, comprising:

a semiconductor substrate;

at least one first raised semiconductor structure of N or P type coupled to the substrate;

at least one second raised semiconductor structure of the other of N or P type coupled to the substrate;

at least one dummy gate structure situated over and encompassing a portion of the at least one first and the at least one second raised semiconductor structures, the dummy gate structure comprising a conformal layer of a dummy gate material and a gate cap layer over the dummy gate material;

a layer of lithographic blocking material over a portion of the dummy gate structure above one of the at least one first raised semiconductor structure and the at least one second raised semiconductor structure;

wherein a top surface of the gate cap layer is planarized below a top surface of the layer of lithographic blocking material.

9. The non-planar semiconductor structure of claim 8, further comprising epitaxy on a top surface of the one of the at least one first raised semiconductor structure and the at least one second raised semiconductor structure.

10. The non-planar semiconductor structure of claim 9, further comprising protective material over a neck of the other of the at least one first raised semiconductor structure and the at least one second raised semiconductor structure.

* * * * *